United States Patent
Pala et al.

(10) Patent No.: US 9,331,197 B2
(45) Date of Patent: May 3, 2016

(54) VERTICAL POWER TRANSISTOR DEVICE

(71) Applicant: Cree, Inc., Durham, NC (US)

(72) Inventors: Vipindas Pala, Morrisville, NC (US); Anant Kumar Agarwal, Chapel Hill, NC (US); Lin Cheng, Chapel Hill, NC (US); Daniel Jenner Lichtenwalner, Raleigh, NC (US); John Williams Palmour, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/962,295

(22) Filed: Aug. 8, 2013

(65) Prior Publication Data

US 2015/0041886 A1     Feb. 12, 2015

(51) Int. Cl.
| | |
|---|---|
| *H01L 27/108* | (2006.01) |
| *H01L 29/94* | (2006.01) |
| *H01L 29/66* | (2006.01) |
| *H01L 21/337* | (2006.01) |
| *H01L 21/8238* | (2006.01) |
| *H01L 29/78* | (2006.01) |
| *H01L 29/08* | (2006.01) |
| *H01L 29/10* | (2006.01) |
| *H01L 29/16* | (2006.01) |

(52) U.S. Cl.
CPC ........ *H01L 29/7827* (2013.01); *H01L 29/0878* (2013.01); *H01L 29/1095* (2013.01); *H01L 29/7802* (2013.01); *H01L 29/1608* (2013.01)

(58) Field of Classification Search
USPC ......... 257/341, 330, 401, 329, 135, 302, 328, 257/E27.054, E27.056, E27.057, E27.058, 257/E29.274, E29.318, E21.383, E21.41, 257/E21.418, E21.447, E21.612; 438/192, 438/206, 209, 336
See application file for complete search history.

(56) References Cited

U.S. PATENT DOCUMENTS

| | | | | |
|---|---|---|---|---|
| 4,126,900 A | * | 11/1978 | Koomen | ........... G11C 11/35 257/261 |
| 4,803,533 A | | 2/1989 | Chang et al. | |
| 7,221,010 B2 | * | 5/2007 | Ryu | ............... H01L 21/8213 257/256 |
| 7,498,633 B2 | * | 3/2009 | Cooper | ........... H01L 29/0696 257/256 |

(Continued)

FOREIGN PATENT DOCUMENTS

| | | |
|---|---|---|
| CN | 1729577 A | 2/2006 |
| EP | 0748520 A1 | 12/1996 |

(Continued)

OTHER PUBLICATIONS

Tsuji et. al. "On-stae Characteristics of SiC Power UMOSFETs on 115-micrometer Drift Layers" Apr. 2005, IEEE Electron Device Letters vol. 26, No. 4.*

(Continued)

*Primary Examiner* — Evan Pert
*Assistant Examiner* — Gustavo Ramallo
(74) *Attorney, Agent, or Firm* — Anthony J. Josephson

(57) ABSTRACT

A power metal-oxide-semiconductor field-effect transistor (MOSFET) includes a substrate, a drift layer over the substrate, and a spreading layer over the drift layer. The spreading layer includes a pair of junction implants separated by a junction gate field effect (JFET) region. A gate oxide layer is on top of the spreading layer. The gate contact is on top of the gate oxide layer. Each one of the source contacts are on a portion of the spreading layer separate from the gate oxide layer and the gate contact. The drain contact is on the surface of the substrate opposite the drift layer.

25 Claims, 17 Drawing Sheets

(56) References Cited

U.S. PATENT DOCUMENTS

| | | | | |
|---|---|---|---|---|
| 7,923,320 | B2* | 4/2011 | Ryu | H01L 21/8213 257/302 |
| 8,178,920 | B2* | 5/2012 | Nakamura | H01L 29/0649 257/330 |
| 8,415,671 | B2* | 4/2013 | Zhang | H01L 29/0623 257/66 |
| 8,492,827 | B2* | 7/2013 | Ryu | H01L 21/8213 257/328 |
| 2005/0253190 | A1* | 11/2005 | Okumura | H01L 29/7813 257/330 |
| 2006/0192256 | A1 | 8/2006 | Cooper et al. | |
| 2008/0142811 | A1* | 6/2008 | Matocha | H01L 29/0878 257/77 |
| 2010/0013007 | A1 | 1/2010 | Miyakoshi | |
| 2011/0193057 | A1* | 8/2011 | Sabathil | H01L 33/04 257/13 |
| 2012/0088339 | A1* | 4/2012 | Molin | H01L 21/823487 438/138 |
| 2012/0280258 | A1* | 11/2012 | Yeh | H01L 33/007 257/88 |
| 2012/0292742 | A1 | 11/2012 | Itoh et al. | |
| 2014/0070268 | A1* | 3/2014 | Yoshimura | H01L 29/0834 257/139 |
| 2014/0077311 | A1* | 3/2014 | Simin | H01L 29/66446 257/401 |
| 2015/0053920 | A1* | 2/2015 | Yeh | H01L 33/14 257/13 |

FOREIGN PATENT DOCUMENTS

| | | |
|---|---|---|
| EP | 1576672 A2 | 9/2005 |
| JP | 2007184434 A | 7/2007 |
| KR | 101020344 B1 | 3/2011 |
| TW | I330894 B | 9/2010 |
| WO | 2012137914 A1 | 10/2012 |

OTHER PUBLICATIONS

Wang, S.R. et al., "Double-Self-Aligned Short-Channel Power DMOSFETs in 4H—SiC," Device Research Conference, Jun. 22-24, 2009, University Park, PA, IEEE, pp. 277-278.

International Search Report and Written Opinion for PCT/US2014/049941, mailed Oct. 22, 2014, 12 pages.

Office Action and Search Report for Taiwanese Patent Application No. 103127134, mailed Oct. 22, 2015, 15 pages.

Decision of Allowance for Taiwanese Patent Application No. 103127134, mailed Feb. 26, 2016, 10 pages.

International Preliminary Report on Patentability for PCT/US2014/049941, mailed Feb. 18, 2016, 8 pages.

\* cited by examiner

VERTICAL POWER TRANSISTOR DEVICE

FIELD OF THE DISCLOSURE

The present disclosure relates to power transistor devices, and in particular to power metal-oxide-semiconductor field-effect transistor (MOSFET) devices.

BACKGROUND

A power metal-oxide-semiconductor field-effect transistor (MOSFET) is a type of transistor that is adapted for use in high power applications. Generally, a power MOSFET device has a vertical structure, wherein a source and gate contact are located on a first surface of the MOSFET device that is separated from a drain contact by a drift layer formed on a substrate. Vertical MOSFETS are sometimes referred to as vertical diffused MOSFETs (VDMOSFETs) or double-diffused MOSFETs (DMOSFETs). Due to their vertical structure, the voltage rating of a power MOSFET is a function of the doping and thickness of the drift layer. Accordingly, high voltage power MOSFETs may be achieved with a relatively small footprint.

FIG. 1 shows a conventional power MOSFET device 10. The conventional power MOSFET device 10 includes a substrate 12, a drift layer 14 formed over the substrate 12, one or more junction implants 16 in the surface of the drift layer 14 opposite the substrate, and a junction gate field effect transistor (JFET) region 18 between each one of the junction implants 16. Each one of the junction implants 16 is formed by an ion implantation process, and includes a deep well region 20, a base region 22, and a source region 24. Each deep well region 20 extends from a corner of the drift layer 14 opposite the substrate 12 downwards towards the substrate 12 and inwards towards the center of the drift layer 14. The deep well region 20 may be formed uniformly or include one or more protruding regions, as shown in FIG. 1. Each base region 22 is formed vertically from the surface of the drift layer 14 opposite the substrate 12 down towards the substrate 12 along a portion of the inner edge of each one of the deep well regions 20. Each source region 24 is formed in a shallow portion on the surface of the drift layer 14 opposite the substrate 12, and extends laterally to overlap a portion of the deep well region 20 and the base region 22, without extending over either. The JFET region 18 defines a channel width 26 between each one of the junction implants 16.

A gate oxide layer 28 is positioned on the surface of the drift layer 14 opposite the substrate 12, and extends laterally between a portion of the surface of each source region 24, such that the gate oxide layer 28 partially overlaps and runs between the surface of each source region 24 in the junction implants 16. A gate contact 30 is positioned on top of the gate oxide layer 28. Two source contacts 32 are each positioned on the surface of the drift layer 14 opposite the substrate 12 such that each one of the source contacts 32 partially overlaps both the source region 24 and the deep well region 20 of one of the junction implants 16, respectively, and does not contact the gate oxide layer 28 or the gate contact 30. A drain contact 34 is located on the surface of the substrate 12 opposite the drift layer 14.

In operation, when a biasing voltage is not applied to the gate contact 30 and the drain contact 34 is positively biased, a junction between each deep well region 20 and the drift layer 14 is reverse biased, thereby placing the conventional power MOSFET 10 in an OFF state. In the OFF state of the conventional power MOSFET 10, any voltage between the source and drain contact is supported by the drift layer 14. Due to the vertical structure of the conventional power MOSFET 10, large voltages may be placed between the source contacts 32 and the drain contact 34 without damaging the device.

FIG. 2 shows operation of the conventional power MOSFET 10 when the device is in an ON state. When a positive bias is applied to the gate contact 30 of the conventional power MOSFET 10, an inversion layer channel 36 is formed at the surface of the drift layer 14 underneath the gate contact 30, thereby placing the conventional power MOSFET 10 in an ON state. In the ON state of the conventional power MOSFET 10, current (shown by the shaded region in FIG. 2) is allowed to flow from each one of the source contacts 32 through the inversion layer channel 36 and into the JFET region 18 of the drift layer 14. Once in the JFET region 18, current flows downward through the drift layer 14 towards the drain contact 34. An electric field presented by junctions formed between the deep well region 20, the base region 22, and the drift layer 14 constricts current flow in the JFET region 18 into a JFET channel 38 having a JFET channel width 40. At a certain spreading distance 42 from the inversion layer channel 36 when the electric field presented by the junction implants 16 is diminished, the flow of current is distributed laterally, or spread out in the drift layer 14, as shown in FIG. 2. The JFET channel width 40 and the spreading distance 42 determine the internal resistance of the power MOSFET 10, thereby dictating the performance of the device. A conventional power MOSFET 10 generally requires a channel width 26 of 3 microns or wider in order to sustain an adequate JFET channel width 40 and spreading distance 42 for proper operation of the device.

The electric field formed by the junctions between the deep well region 20, the base region 22, and the drift layer 14 radiates through the gate oxide layer 28, thereby physically degrading the gate oxide layer 28 over time. Eventually, the electric field will cause the gate oxide layer 28 to break down, and the conventional power MOSFET 10 will cease to function.

Accordingly, a power MOSFET is needed that is capable of handling high voltages in the OFF state while maintaining a low ON state resistance and having an improved longevity.

SUMMARY

The present disclosure relates to a transistor device including a substrate, a drift layer over the substrate, and a spreading layer over the drift layer. The spreading layer includes a pair of junction implants separated by a junction gate field effect (JFET) region. Each one of the junction implants may include a deep well region, a base region, and a source region. The transistor device further includes a gate oxide layer, a gate contact, a pair of source contacts, and a drain contact. The gate oxide layer is on a portion of the spreading layer such that the gate oxide layer partially overlaps and runs between each source region of each junction implant. The gate contact is on top of the gate oxide layer. Each one of the source contacts are on a portion of the spreading layer such that each source contact partially overlaps both the source region and the deep well region of each junction implant, respectively. The drain contact is on the surface of the substrate opposite the drift layer.

According to one embodiment, the spreading layer has a graded doping profile, such that the doping concentration of the spreading layer decreases in proportion to the distance of the point in the spreading layer from the JFET region.

According to an additional embodiment, the spreading layer includes multiple layers, each having a different doping concentration that progressively decreases in proportion to the distance of the layer from the JFET region.

By placing a spreading layer over the drift layer, the space between each junction implant, or length of the JFET region, can be reduced while simultaneously maintaining or reducing the ON resistance of the device. By reducing the space between each junction implant, a larger portion of the electric field generated during reverse bias of the transistor device is terminated by each one of the junction implants, thereby reducing the electric field seen by the gate oxide layer and increasing the longevity of the device.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
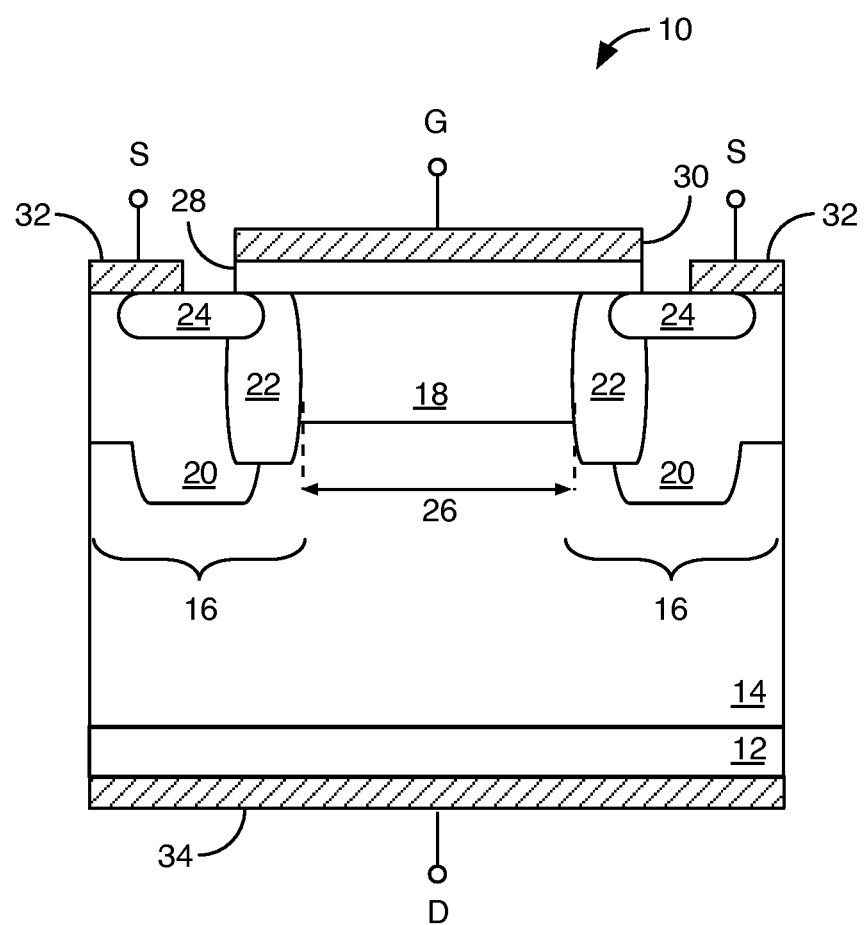
FIG. 1 shows a schematic representation of a conventional power MOSFET device.
Figure 2:
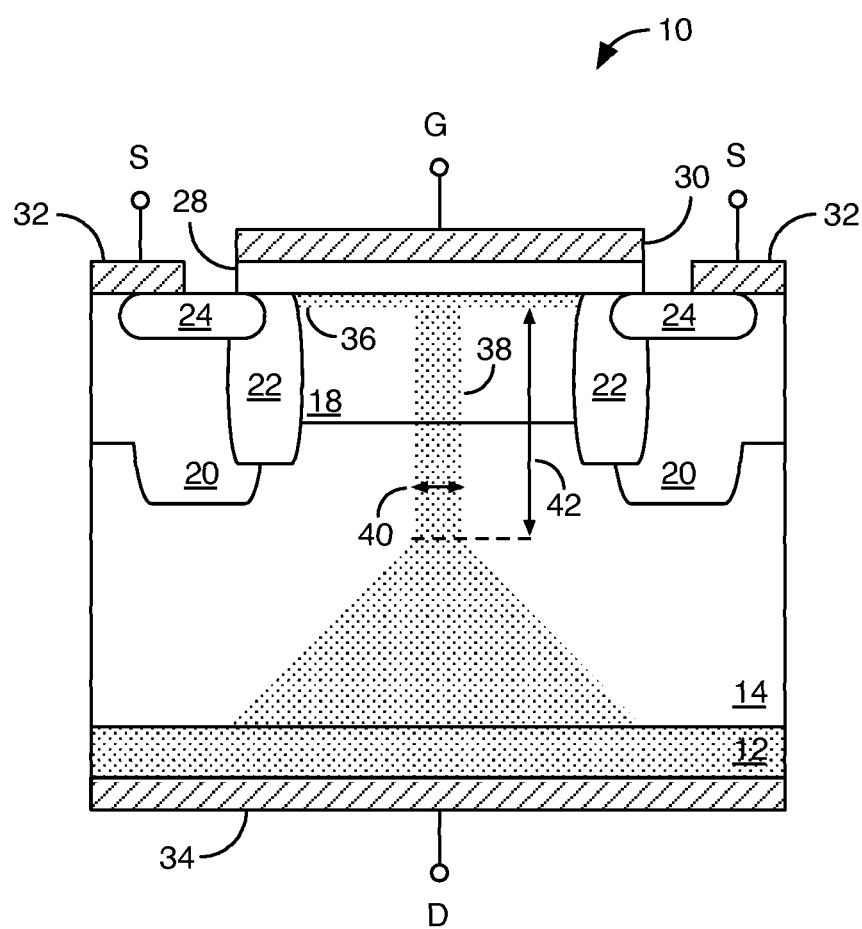
FIG. 2 shows details of the operation of the conventional power MOSFET device shown in FIG. 1.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 3:
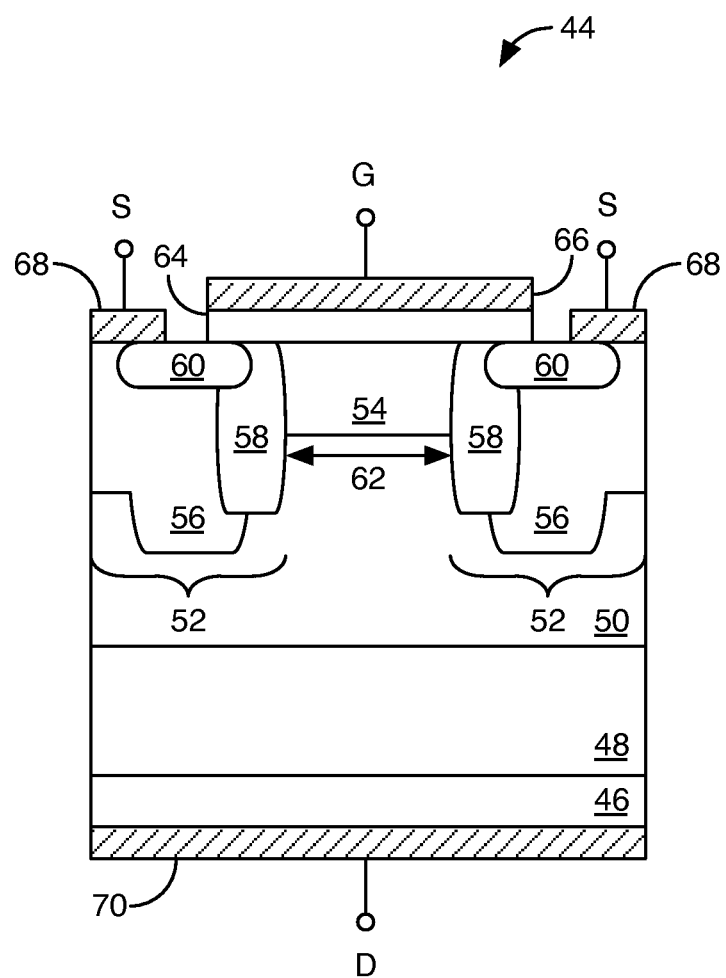
FIG. 3 shows a power MOSFET device according to one embodiment of the present disclosure.

Turning now to FIG. 3, a power MOSFET device 44 is shown according to one embodiment of the present disclosure. The power MOSFET device 44 includes a substrate 46, a drift layer 48 formed over the substrate 46, a spreading layer 50 formed over the drift layer 48, one or more junction implants 52 in the surface of the spreading layer 50 opposite the drift layer 48, and a junction gate field effect transistor (JFET) region 54 between each one of the junction implants 52. Each one of the junction implants 52 may be formed by an ion implantation process, and may include a deep well region 56, a base region 58, and a source region 60. Each deep well region 56 extends from a corner of the spreading layer 50 opposite the drift layer 48 downwards towards the drift layer 48 and inwards towards the center of the spreading layer 50. The deep well region 56 may be formed uniformly or include one or more protruding regions. Each base region 58 is formed vertically from the surface of the spreading layer 50 opposite the drift layer 48 downwards towards the drift layer 48 along a portion of the inner edge of each one of the deep well regions 56. Each source region 60 is formed in a shallow portion on the surface of the spreading layer 50 opposite the drift layer 48, and extends laterally to overlap a portion of the deep well region 56 and the base region 58, without extending over either. The JFET region 54 defines a channel width 62 between each one of the junction implants 52.

A gate oxide layer 64 is positioned on the surface of the spreading layer 50 opposite the drift layer 48, and extends laterally between a portion of the surface of each source region 60, such that the gate oxide layer 64 partially overlaps and runs between the surface of each source region 60 in the junction implants 52. A gate contact 66 is positioned on top of the gate oxide layer 64. Two source contacts 68 are each positioned on the surface of the spreading layer 50 opposite the drift layer 48 such that each one of the source contacts 68 partially overlaps both the source region 60 and the deep well region 56 of the junction implants 52, respectively, and does not contact the gate oxide layer 64 or the gate contact 66. A drain contact 70 is located on the surface of the substrate 46 opposite the drift layer 48.

In operation, when a biasing voltage is not applied to the gate contact 66 and the drain contact 70 is positively biased, a junction between each deep well region 56 and the spreading layer 50 is reverse biased, thereby placing the power MOSFET 44 in an OFF state. In an OFF state of the power MOSFET 44, any voltage between the source and drain contact is supported by the drift layer 48 and the spreading layer 50. Due to the vertical structure of the power MOSFET 44, large voltages may be placed between the source contacts 68 and the drain contact 70 without damaging the device.

Figure 4:
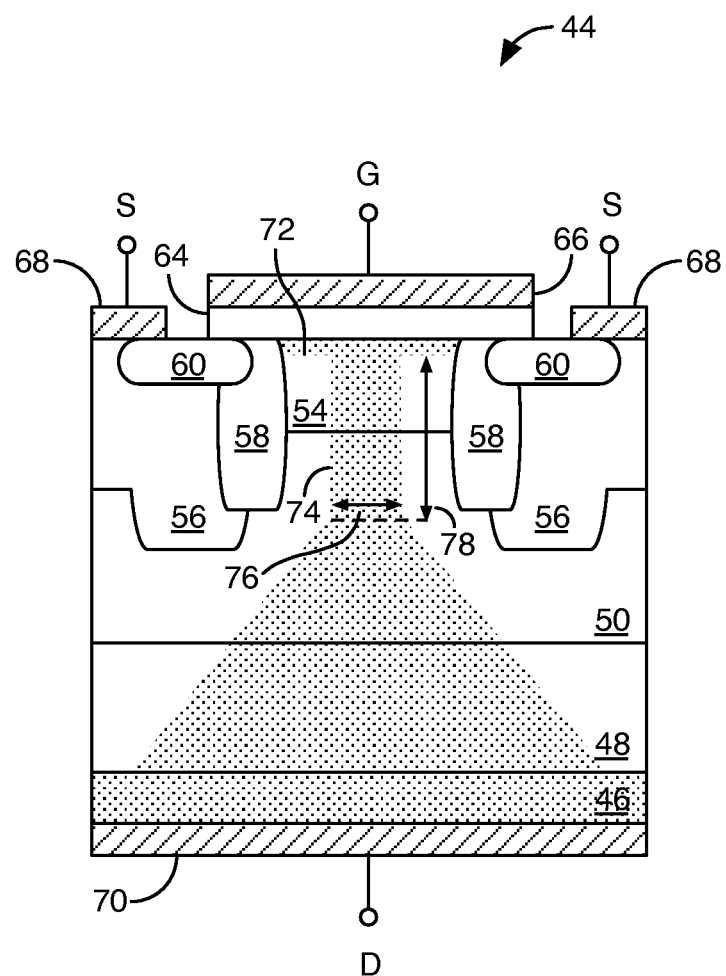
FIG. 4 shows details of the operation of the power MOSFET device shown in FIG. 3 according to one embodiment of the present disclosure.

FIG. 4 shows the operation of the power MOSFET 44 when the device is in an ON state. When a positive bias is applied to the gate contact 66 of the power MOSFET 44, an inversion layer channel 72 is formed at the surface of the spreading layer 50 underneath the gate contact 66, thereby placing the power MOSFET 44 in an ON state. In the ON state of the power MOSFET 44, current (shown by the shaded region in FIG. 4) is allowed to flow from each one of the source contacts 68 through the inversion layer channel 72 and into the JFET region 54. Once in the JFET region 54, current flows downward through the spreading layer 50 towards the drain contact 70. An electric field presented by the junctions formed between the deep well region 56, the base region 58, and the spreading layer 50 constricts current flow in the JFET region 54 into a JFET channel 74 having a JFET channel width 76.

At a certain spreading distance 78 from the inversion layer channel 72 when the electric field presented by the junction implants 52 is diminished, the flow of current is distributed laterally, or spread out, in the spreading layer 50, as shown in FIG. 4. The spreading layer 50 is doped in such a way to decrease resistance in the spreading layer 50, thereby mitigating the effects of the electric field by increasing the JFET channel width 76 and decreasing the spreading distance 78. By increasing the JFET channel width 76 and decreasing the spreading distance 78, the spreading layer 50 significantly reduces the ON resistance of the power MOSFET 44. For example, the ON resistance of the power MOSFET 44 may be about 2.2 mΩ/cm$^2$ when the device is rated to handle 1200V and about 1.8 mΩ/cm$^2$ when the device is rated to handle 600V.

By reducing the ON resistance of the power MOSFET 44, the spreading layer 50 allows for a reduction of the channel width 62 between each one of the junction implants 52. Reducing the channel width 62 of the power MOSFET 44 not only improves the footprint of the device, but also the longevity. As each one of the junction implants 52 is moved closer to one another, a larger portion of the electric field generated by the junctions between the deep well region 56, the base region 58, and the spreading layer 50 is terminated by the opposite junction implant 52. Accordingly, the electric field seen by the gate oxide layer 64 is significantly reduced, thereby resulting in improved longevity of the power MOSFET 44. According to one embodiment, the channel width 62 of the power MOSFET 44 is less than 3 microns.

The power MOSFET 44 may be, for example, a silicon carbide (SiC), gallium arsenide (GaAs), or gallium nitride (GaN) device. Those of ordinary skill in the art will appreciate that the concepts of the present disclosure may be applied to any materials system. The substrate 46 of the power MOSFET 44 may be about 180-350 microns thick. The drift layer 48 may be about 3.5-12 microns thick, depending upon the voltage rating of the power MOSFET 44. The spreading layer 50 may be about 1.0-2.5 microns thick. Each one of the junction implants 52 may be about 1.0-2.0 microns thick. The JFET region 54 may be about 0.75-1.5 microns thick.

According to one embodiment, the spreading layer 50 is an N-doped layer with a doping concentration from about $2\times10^{17}$ cm$^{-3}$ to $5\times10^{16}$ cm$^{-3}$. The spreading layer 50 may be graded, such that the portion of the spreading layer 50 closest to the drift layer 48 has a doping concentration about $5\times10^{16}$ cm$^{-3}$ that is graduated as the spreading layer 50 extends upwards to a doping concentration of about $2\times10^{17}$ cm$^{-3}$. According to an additional embodiment, the spreading layer 50 may comprise multiple layers. The layer of the spreading layer 50 closest to the drift layer 48 may have a doping concentration about $5\times10^{16}$ cm$^{-3}$. The doping concentration of each additional layer in the spreading layer may decrease in proportion to the distance of the layer from the JFET region 54. The layer of the spreading layer 50 closest to the drift layer 48 may have a doping concentration about $2\times10^{17}$ cm$^{-3}$.

The JFET region 54 may be an N-doped layer with a doping concentration from about $1\times10^{16}$ cm$^{-3}$ to $2\times10^{17}$ cm$^{-3}$. The drift layer 48 may be an N-doped layer with a doping concentration from about $6\times10^{15}$ cm$^{-3}$ to $1.5\times10^{16}$ cm$^{-3}$. The deep well region 56 may be a heavily P-doped region with a doping concentration from about $5\times10^{17}$ cm$^{-3}$ to $1\times10^{20}$ cm$^{-3}$. The base region 58 may be a P-doped region with a doping concentration from about $5\times10^{16}$ cm$^{-3}$ to $1\times10^{19}$ cm$^{-3}$. The source region 60 may be an N-doped region with a doping concentration from about $1\times10^{19}$ cm$^{-3}$ to $1\times10^{21}$ cm$^{-3}$. The N doping agent may be nitrogen, phosphorous, or any other suitable element, as will be appreciated by those of ordinary skill in the art. The P doping agent may be aluminum, boron, or any other suitable element, as will be appreciated by those of ordinary skill in the art.

The gate contact 66, the source contacts 68, and the drain contact 70 may be comprised of multiple layers. For example, each one of the contacts may include a first layer of nickel or nickel-aluminum, a second layer of titanium over the first layer, a third layer of titanium-nickel over the second layer, and a fourth layer of aluminum over the third layer. Those of ordinary skill in the art will appreciate that the gate contact 66, the source contacts 68, and the drain contact 70 may be formed of any suitable material.

Figure 5:
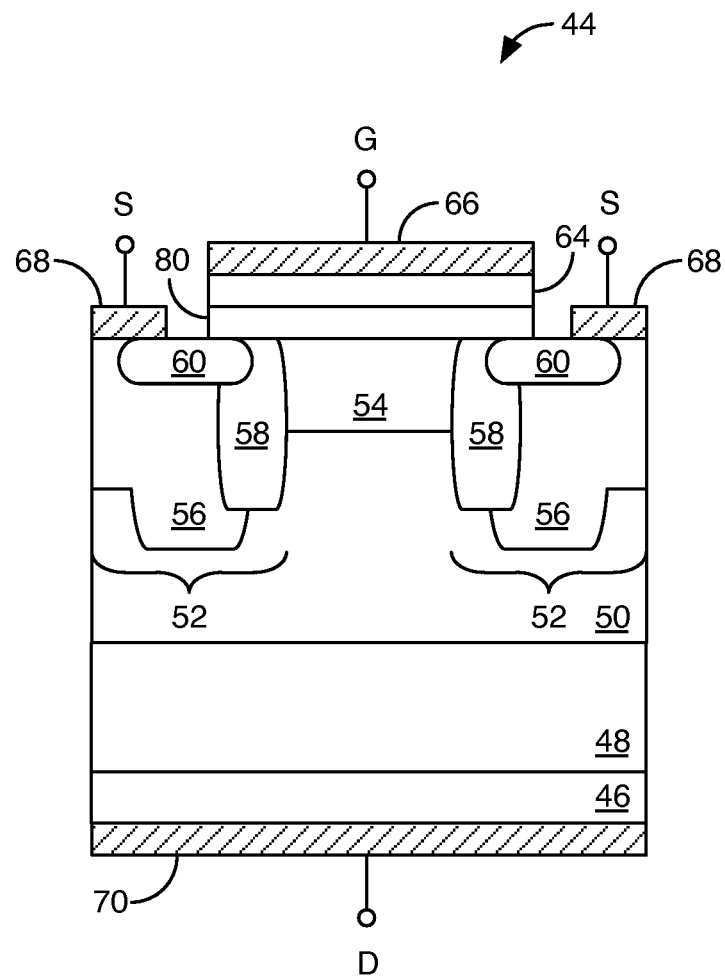
FIG. 5 shows an alternative embodiment of the power MOSFET device shown in FIG. 3.
Figure 6:
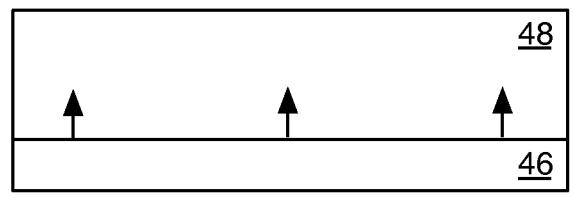
FIGS. 6-15 illustrate a process for manufacturing the power MOSFET device shown in FIG. 3.

FIG. 5 shows the power MOSFET 44 according to an additional embodiment of the present disclosure. The power MOSFET 44 shown in FIG. 5 is substantially similar to that of FIG. 3, but further includes a channel Re-growth layer 80 between the gate oxide layer 64 and the spreading layer 50. The channel re-growth layer 80 is provided to lower the threshold voltage of the power MOSFET 44. Specifically, the deep well region 56, due to a heavy level of doping, may raise the threshold voltage of the power MOSFET 44 to a level that inhibits optimum performance. Accordingly, the channel re-growth layer 80 may offset the effects of the deep well region 56 in order to lower the threshold voltage of the power MOS- FET 44. The channel re-growth layer 80 may be an N-doped region with a doping concentration from about $1 \times 10^{15}$ cm$^{-3}$ to $1 \times 10^{17}$ cm$^{-3}$ FIGS. 6-15 illustrate a process for manufacturing the power MOSFET 44 shown in FIG. 3. First, as illustrated by FIG. 6, the drift layer 48 is grown on top of the substrate 46. Those of ordinary skill in the art will recognize that any suitable growth process may be used to produce the drift layer 48 without departing from the principles of the present disclosure. For example, a chemical vapor deposition process may be used to form the drift layer 48.

Figure 7:
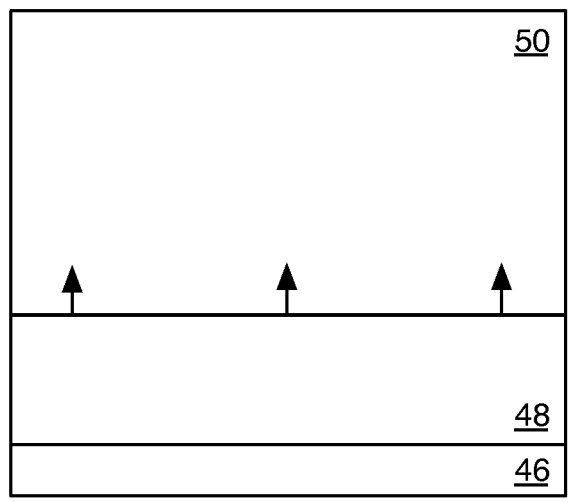

Next, as illustrated by FIG. 7, the spreading layer 50 is grown on top of the drift layer 48. As discussed above, any suitable growth process may be used to create the spreading layer 50 without departing from the principles of the present disclosure. According to one embodiment, the spreading layer 50 is grown such that it includes a graded doping profile.

Figure 8:
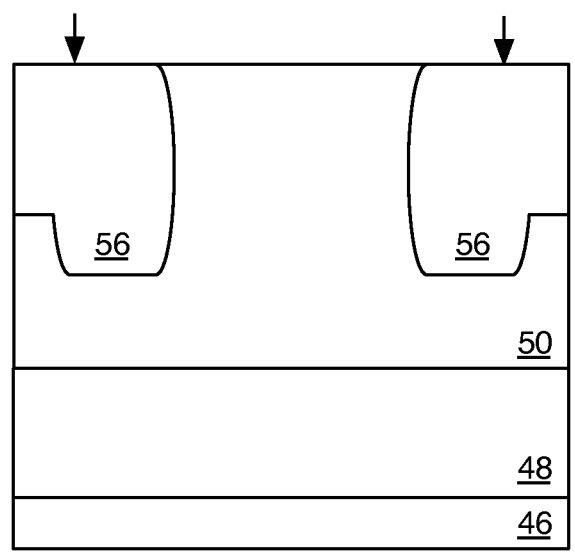
Figure 9:
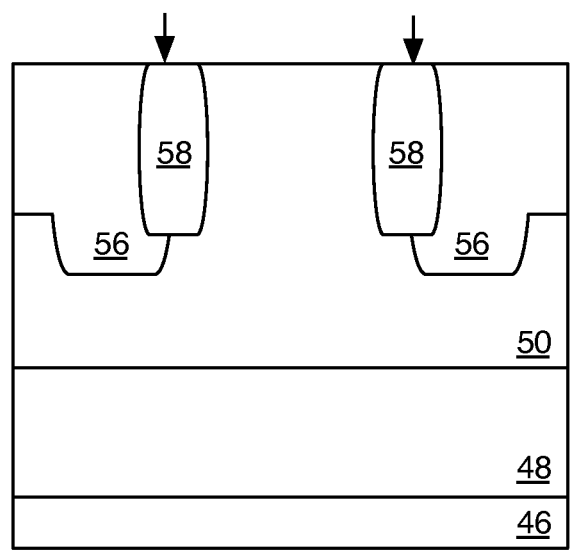
Figure 10:
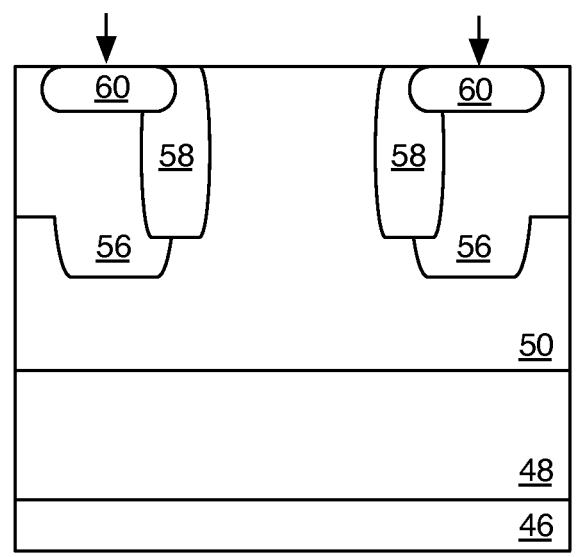

Next, as illustrated by FIG. 8, the deep well region 56 of each one of the junction implants 52 is implanted in the spreading layer 50. As will be appreciated by those of ordinary skill in the art, the deep well regions 56 may be implanted by any suitable implantation process. For example, an ion implantation process may be used to form the deep well regions 56. The base regions 58 are then implanted, as illustrated by FIG. 9, followed by the source regions 60, as illustrated by FIG. 10.

Figure 11:
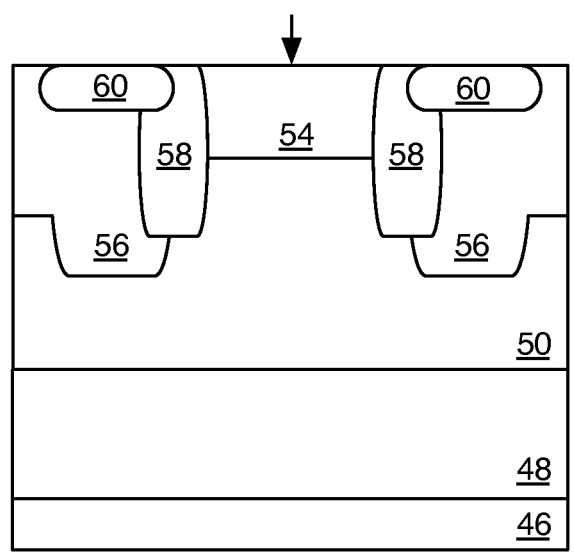

Next, as illustrated by FIG. 11, the JFET region 54 is implanted. As discussed above, any suitable implantation process may be used to create the JFET region 54 without departing from the principles of the present disclosure. Additionally, although not illustrated, the JFET region 54 may alternatively be created by a growth process.

Figure 12:
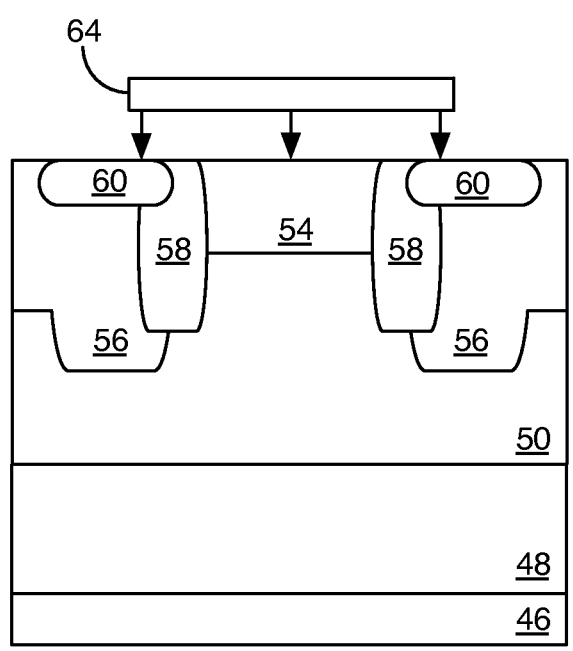
Figure 13:
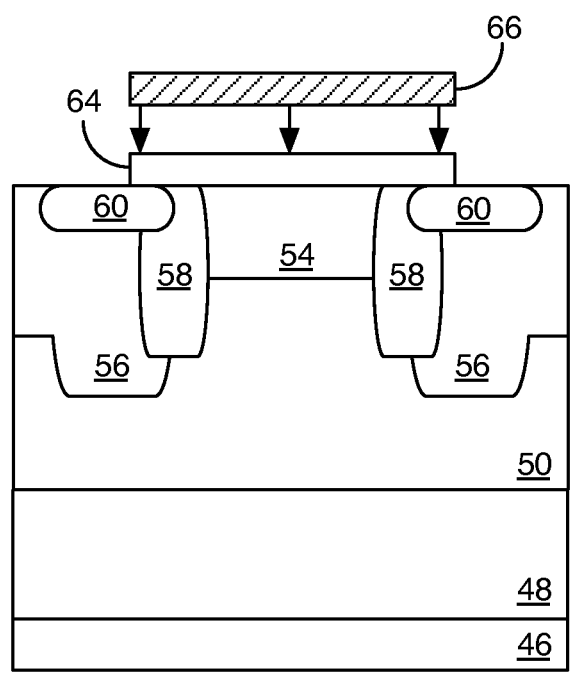
Figure 14:
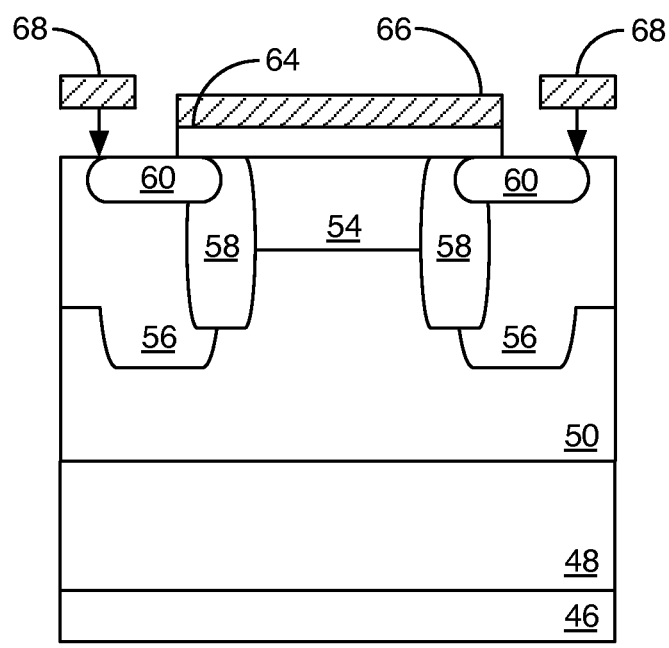
Figure 15:
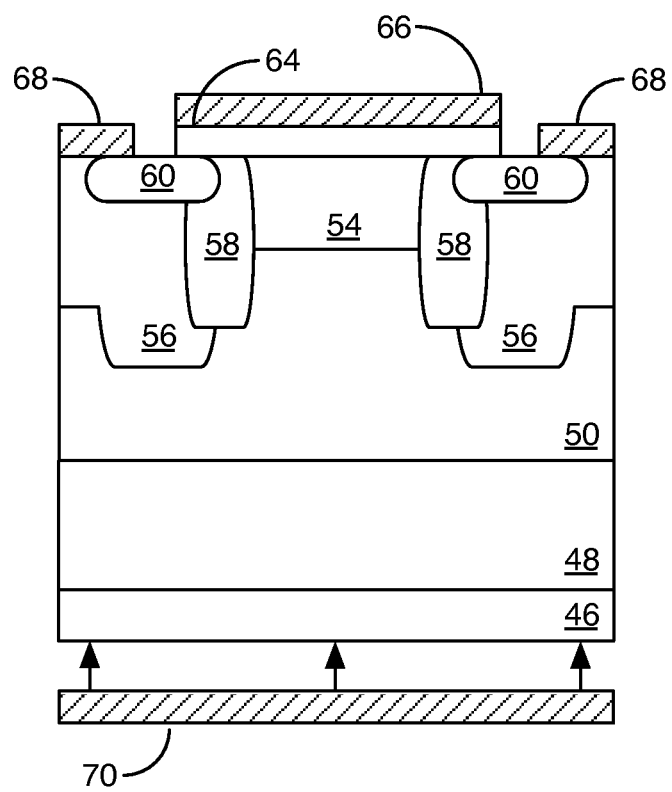

Next, as illustrated by FIG. 12, the gate oxide layer 64 is formed on top of the spreading layer 50, such that the gate oxide layer 64 partially overlaps and runs between the surface of each source region 60 in the junction implants 52. In FIG. 13, the gate contact 66 is formed on top of the gate oxide layer 64. The source contacts 68 are then formed on the surface of the spreading layer 50 such that each one of the source contacts 68 partially overlaps both the source region 60 and the deep well region 56 of the junction implants 52, respectively, and does not contact the gate oxide layer 64 or the gate contact 66, as illustrated by FIG. 14. Finally, in FIG. 15, the drain contact 70 is provided on the surface of the substrate 46 opposite the drift layer 48.

Figure 16:
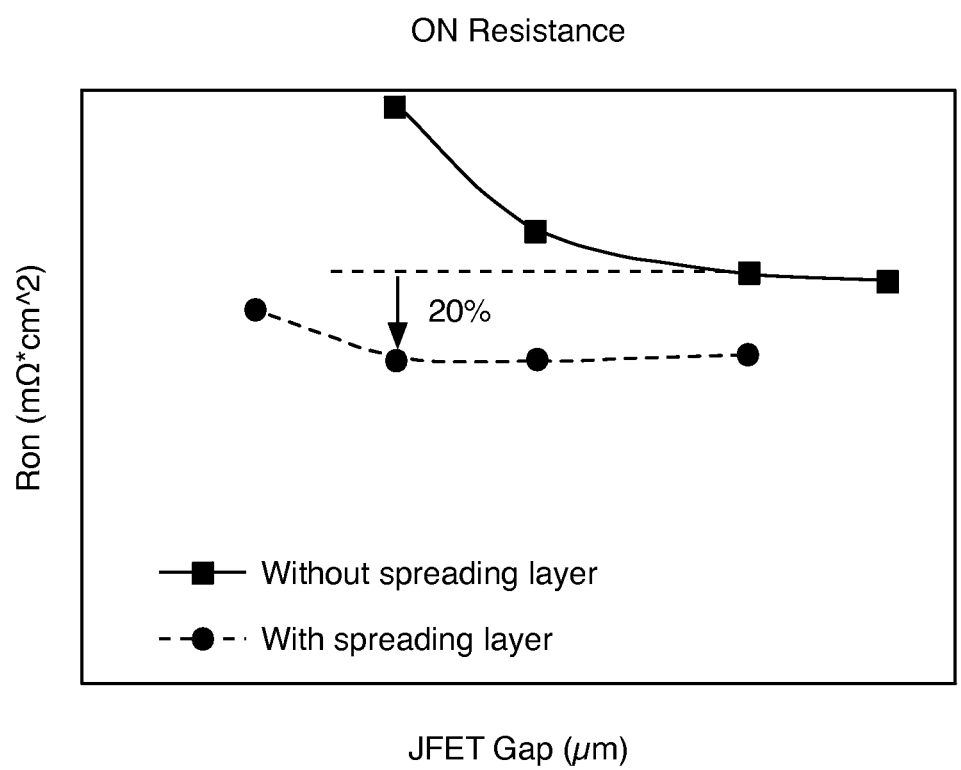
FIG. 16 shows a graph indicating performance improvements achieved by the power MOSFET device shown in FIG. 3.

FIG. 16 is a chart depicting the effect of the spreading layer 50 on the ON resistance of the power MOSFET 44. As shown, the spreading layer provides about a 20% decrease in the ON resistance of the device.

Figure 17:
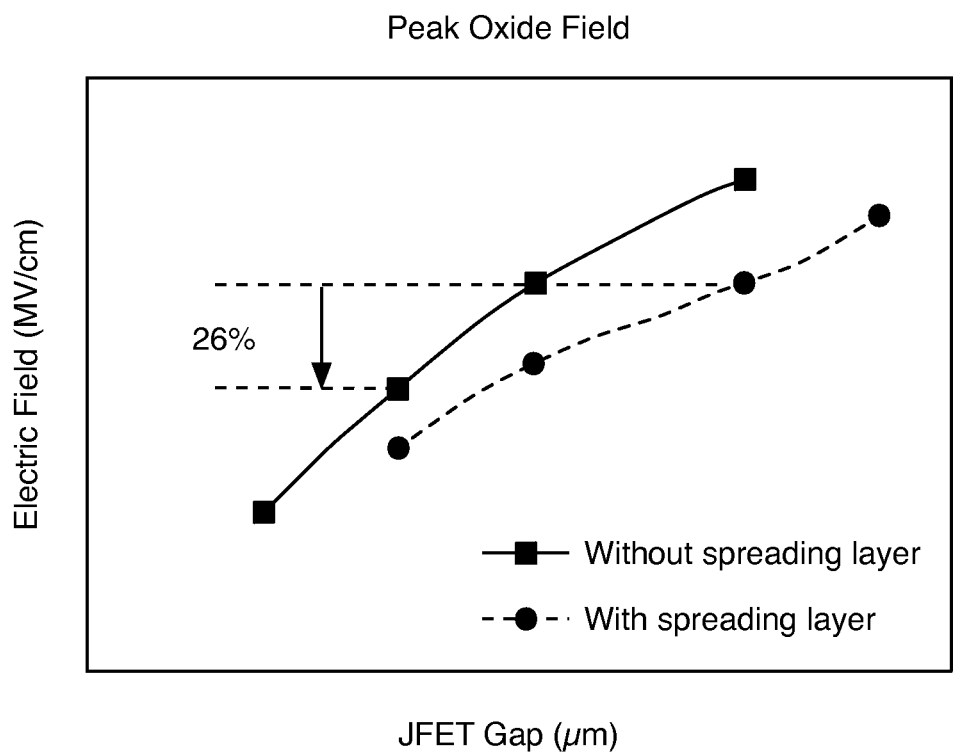
FIG. 17 shows a graph indicating longevity improvements achieved by the power MOSFET device shown in FIG. 3.

FIG. 17 is a chart depicting the effect of the spreading layer 50 on the electric field seen by the gate oxide layer 64. Because the spreading layer 50 allows a reduction in channel width 62 without impeding the performance of the power MOSFET 44, up to 26% of the electric field seen by the gate oxide layer 64 may be terminated by the opposing junction implants 52, thereby significantly increasing the longevity of the device.

Those skilled in the art will recognize improvements and modifications to the preferred embodiments of the present disclosure. All such improvements and modifications are considered within the scope of the concepts disclosed herein and the claims that follow.

What is claimed is:

1. A transistor device comprising a gate, a source, and a drain, wherein the gate and the source are separated from the drain by at least a JFET region, a spreading layer including a graded doping profile, and a drift layer, wherein a doping concentration of the spreading layer varies more than a factor of about $10^2$ cm$^{-3}$ between the JFET region and the drift layer.

2. The transistor device of claim 1 wherein the JFET region, the spreading layer, and the drift layer comprise silicon carbide.

3. The transistor device of claim 1 wherein the transistor device is a vertically disposed metal-oxide-semiconductor field-effect transistor (MOSFET).

4. The transistor device of claim 1 wherein the JFET region has a first doping concentration, the spreading layer has a second doping concentration that is different from the first doping concentration, and the drift layer has a third doping concentration that is different from the first doping concentration and the second doping concentration.

5. The transistor device of claim 4 wherein the spreading layer has a doping concentration in the range of approximately $2 \times 10^{17}$ cm$^{-3}$ to approximately $5 \times 10^{16}$ cm$^{-3}$.

6. The transistor device of claim 4 wherein the JFET region has a doping concentration in the range of approximately $1 \times 10^{16}$ cm$^{-3}$ to approximately $2 \times 10^{17}$ cm$^{-3}$.

7. The transistor device of claim 1 wherein a thickness of the JFET region is in the range of approximately 0.75 microns to approximately 1 micron.

8. The transistor device of claim 1 wherein a thickness of the spreading layer is in the range of approximately 1.0 microns to approximately 2.5 microns.

9. The transistor device of claim 1 wherein a thickness of the drift layer is in the range of approximately 3.5 microns to approximately 12 microns.

10. The transistor device of claim 1 wherein an internal resistance of the transistor device is less than approximately 2.2 mΩ/cm$^2$.

11. The transistor device of claim 1 wherein the transistor device is adapted to support a voltage between the source and the drain of at least 600V while in an OFF state, and further wherein the transistor device has an internal resistance of less than approximately 1.8 mΩ/cm$^2$.

12. The transistor device of claim 1 wherein the transistor device is adapted to support a voltage between the source and the drain of at least 1200V while in an OFF state, and further wherein the transistor device has an internal resistance of less than approximately 2.2 mΩ/cm$^2$.

13. A transistor device comprising:
a substrate;
a drift layer on the substrate;
a spreading layer on the drift layer, the spreading layer having a graded doping profile such that a doping concentration of the spreading layer varies more than a factor of about $10^2$ cm$^{-3}$ between a JFET region and the drift layer;
a pair of junction implants in the spreading layer and separated by the JFET region, each one of the pair of junction implants comprising a deep well region, a base region, and a source region;
a gate contact and a source contact on the spreading layer, such that the gate contact partially overlaps and runs between each source region in the pair of junction implants; and
a drain contact on the substrate opposite the drift layer.

14. The transistor device of claim 13 further comprising a gate oxide layer between the gate contact and the spreading layer.

15. The transistor device of claim 13 wherein the source contact is divided into two sections, and each section of the source contact is on a portion of the spreading layer such that each section of the source contact partially overlaps both the source region and the deep well region of each one of the pair of junction implants, respectively.

16. The transistor device of claim 13 wherein the transistor device is a vertically disposed metal-oxide-semiconductor field-effect transistor (MOSFET).

17. The transistor device of claim 13 wherein the drift layer and the spreading layer comprise silicon carbide.

18. The transistor device of claim 13 wherein a width of the JFET region is approximately 3 microns or less.

19. The transistor device of claim 18 wherein an internal resistance of the transistor device is less than approximately 2.2 mΩ/cm$^2$.

20. The transistor device of claim 13 wherein the transistor device is adapted to support a voltage between the source contact and the drain contact of at least 600V while in an OFF state, and further wherein the transistor device has an internal resistance of less than approximately 1.8 mΩ/cm$^2$.

21. The transistor device of claim 13 wherein the transistor device is adapted to support a voltage between the source contact and the drain contact of at least 1200V while in an OFF state, and further wherein the transistor device has an internal resistance of less than approximately 2.2 mΩ/cm$^2$.

22. The transistor device of claim 13 wherein a thickness of the drift layer is in the range of approximately 3.5 microns to approximately 12 microns.

23. The transistor device of claim 13 wherein a thickness of the spreading layer is in the range of approximately 1.0 microns to approximately 2.5 microns.

24. The transistor device of claim 13 wherein a thickness of the JFET region is in the range of approximately 0.75 microns to approximately 1.0 microns.

25. The transistor device of claim 13 wherein a thickness of each one of the pair of junction implants is in the range of approximately 1.0 microns to approximately 2.0 microns.

* * * * *